United States Patent
Chiou et al.

(10) Patent No.: US 7,023,700 B2
(45) Date of Patent: Apr. 4, 2006

(54) HEAT SINK RIVETED TO MEMORY MODULE WITH UPPER SLOTS AND OPEN BOTTOM EDGE FOR AIR FLOW

(75) Inventors: Ren-Kang Chiou, Fremont, CA (US); Tzu-Yih Chu, San Jose, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 218 days.

(21) Appl. No.: 10/707,623

(22) Filed: Dec. 24, 2003

(65) Prior Publication Data

US 2005/0141199 A1     Jun. 30, 2005

(51) Int. Cl.
*H05K 7/20* (2006.01)
(52) U.S. Cl. .................. 361/704; 361/816; 361/818; 361/753; 361/794; 439/609; 439/610
(58) Field of Classification Search ................. 361/704
See application file for complete search history.

(56) References Cited

U.S. PATENT DOCUMENTS

| | | | | |
|---|---|---|---|---|
| 5,208,729 | A * | 5/1993 | Cipolla et al. ............. | 361/690 |
| 5,268,815 | A * | 12/1993 | Cipolla et al. ............. | 361/704 |
| 5,543,660 | A | 8/1996 | Dombroski ................ | 257/707 |
| 6,188,576 | B1 * | 2/2001 | Ali et al. .................. | 361/704 |
| 6,233,150 | B1 * | 5/2001 | Lin et al. .................. | 361/704 |
| 6,343,020 | B1 * | 1/2002 | Lin et al. .................. | 361/816 |
| 6,362,966 | B1 | 3/2002 | Ali et al. .................. | 361/728 |
| 6,424,532 | B1 | 7/2002 | Kawamura ................ | 361/708 |
| 6,449,156 | B1 | 9/2002 | Han et al. ................. | 361/704 |
| 6,473,306 | B1 | 10/2002 | Koseki et al. ............. | 361/704 |
| 6,535,387 | B1 | 1/2003 | Summers et al. .......... | 361/704 |

OTHER PUBLICATIONS

OCZ Memory DDR PC-3200, rev.2 Data Sheet, OCZ Technology, Oct. 6, 2003, pp. 1-3.
CMX256A-3200C2 Data Sheet, Corsair Memory Inc., 1 page, Jul. 2002.

* cited by examiner

*Primary Examiner*—Boris Chervinsky
*Assistant Examiner*—Biju Chandran
(74) *Attorney, Agent, or Firm*—Stuart T. Auvinen

(57) ABSTRACT

A memory module has a two-plate heat sink attached by rivets. A front plate contacts the flat surfaces of memory chips on a front surface of the module printed-circuit board (PCB) substrate, while another back plate contacts chips on the back surface of the substrate. The plates contact the substrate along the top edge opposite the connector edge, and along the upper half of the substrate's side edges. Holes in the substrate allow for rivets or other fasteners to pass through to firmly attach the plates to the substrate, prevent wobble. Four top-edge slots are cut in the plates near the top edge, between the rivets along the top edge. The top-edge slots allow air to flow underneath the plates, in small gaps between memory chips, and between the plate and the substrate. The added air flow underneath the plates helps cool the heat-sink plates, reduce hot spots and failures.

20 Claims, 4 Drawing Sheets

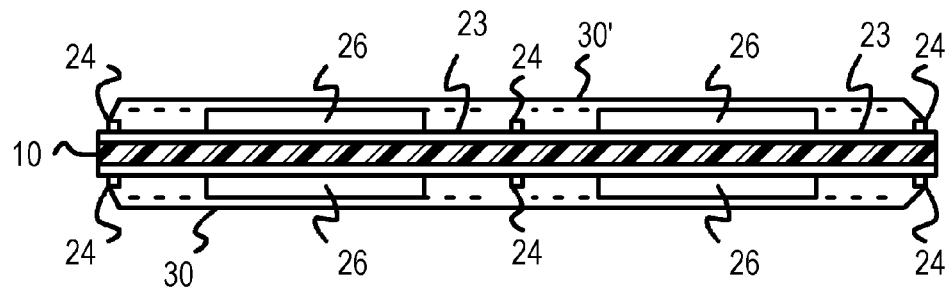
FIG. 3A  TOP VIEW
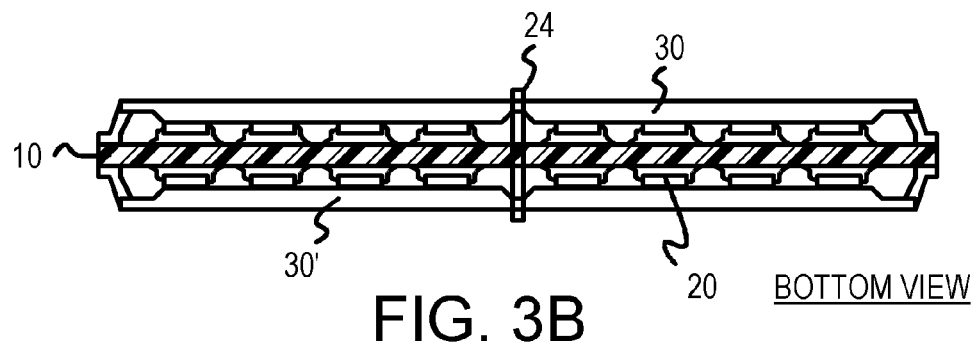
FIG. 3B  BOTTOM VIEW
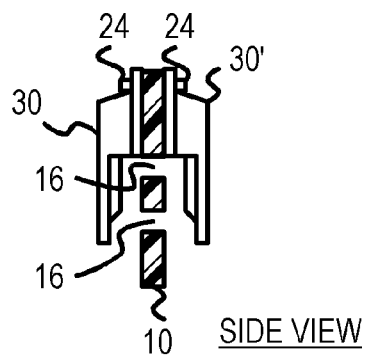
FIG. 3C  SIDE VIEW
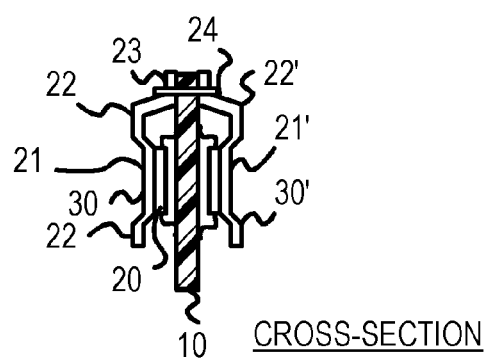
FIG. 3D  CROSS-SECTION

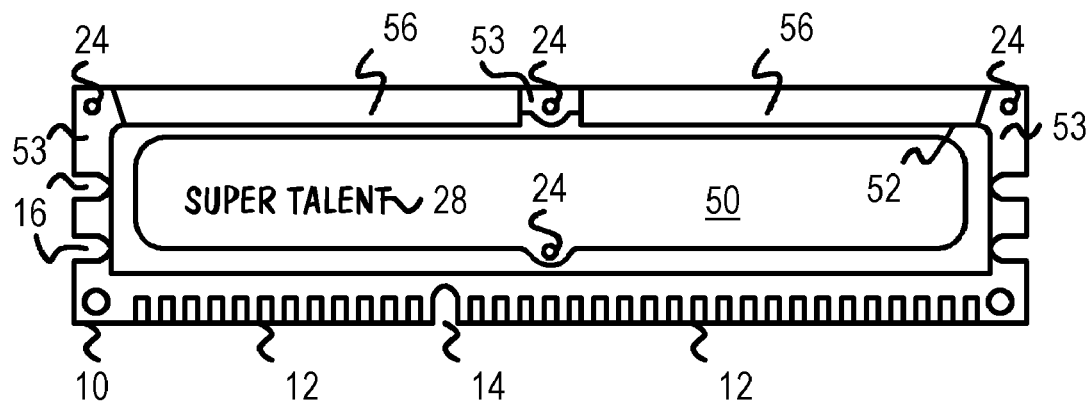
FIG. 6A
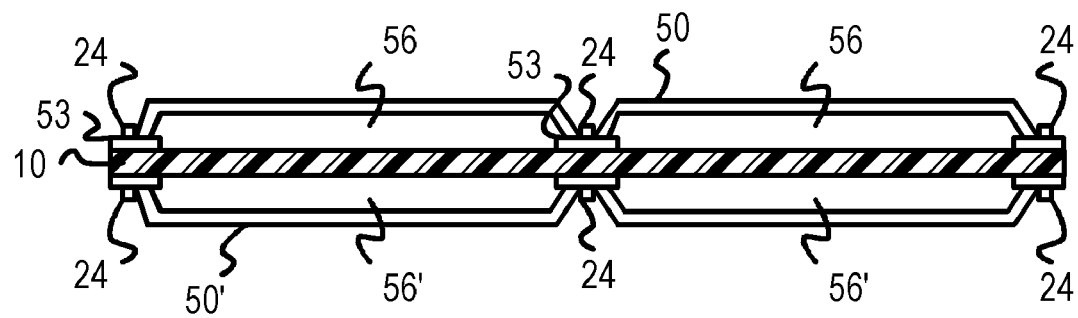
FIG. 6B    TOP VIEW

HEAT SINK RIVETED TO MEMORY MODULE WITH UPPER SLOTS AND OPEN BOTTOM EDGE FOR AIR FLOW

BACKGROUND OF INVENTION

This invention relates to heat sinks, and more particularly to heat sinks for memory modules.

Heat sinks have been widely used to assist in cooling electrical components. Some microprocessors have heat sinks attached to allow for higher-frequency operation. Other components such as memory modules may also benefit from heat sinks.

Most personal computers (PC's) are shipped with sockets for memory modules so that their owners can later add additional modules, increasing the memory capacity of the PC. Other non-PC devices may also use memory modules designed for PC's. High-volume production and competition have driven module costs down dramatically, benefiting the buyer.

Memory modules are made in many different sizes and capacities, with the older 30-pin modules replaced by 72-pin, 168-pin, and other size modules. The "pins" were originally pins extending from the module's edge, but now most modules are leadless, having metal contact pads, fingers, or leads. The modules are small in size, some being about 5.25 inches long and 1.2 or 1.7-inches high.

The modules contain a small printed-circuit board (PCB) substrate, typically a multi-layer board with alternating laminated layers of fiberglass insulation and foil or metal interconnection layers. Surface mounted components are soldered onto one or both surfaces of the substrate. Memory integrated circuits (IC's) or chips are commonly packaged in inexpensive surface-mount packages such as small-outline J-leaded (SOJ) packages, plastic leaded chip carriers (PLCC's), thin small-outline packages (TSOP) or small-outline (SO) packages. The number of memory chips in a module depends on the capacity and the data-width of the memory chips and the size of the memory module.

FIG. 1 is a diagram of a memory module with dynamic-random-access memory (DRAM) chips. The memory module contains substrate 10, with surface-mounted DRAM chips 20 mounted directly to the front surface or side of substrate 10, while more DRAM chips (not visible) are usually mounted to the back side or surface of substrate 10. Metal contact pads 12 are positioned along the bottom or connector edge of the module on both front and back surfaces. Metal contact pads 12 mate with pads on a module socket to electrically connect the module to a PC's motherboard. Holes and/or notches 14, 16 are sometimes used to ensure that the module is correctly positioned in the socket. For example, notch 14 can be offset from the center of substrate 10 to ensure that the memory module cannot be inserted backwards in a socket. Notches 16 match with clamps of the module socket to ensure that module is securely positioned in the socket.

As processor speeds have increased, the need for faster memory has become more critical. Various bandwidth-enhancing methods and memory interfaces have been used. Memory chips have higher densities and operate at higher frequencies than before, producing more waste heat from the memory chips. There is a need to remove this waste heat from memory modules.

Various heat sinks designed for memory modules are known. See for example U.S. Pat. Nos. 6,362,966, 6,424,532, and 6,449,156, among others. Clamp-on heat sinks for memory modules are also known. For example, Corsair Memories makes a heat sink that fits over the front and back surfaces of a memory module and is held in place by a wire clip over the top edge. OCZ Technology produces a copper heat sink with wider metal bands that clip the heat sink to over the front and back surfaces of the memory module. While useful, these clip-on and clamp-on designs can exhibit a flimsiness or lack of rigidity that can make the memory modules appear cheaply made.

Some memory-module heat sinks feature a closed-top design that prevents air flow in the small gaps between the heat sink and the memory module substrate. Often the entire top edge of the heat sink is closed, providing no path for air to flow under the heat sink other than back out the bottom edge, which is usually open. Sides may be open or partially open, but the sides are much smaller than the top and bottom edges of the memory module, limiting the possible air flow.

What is desired is a heat sink designed specifically for memory modules. A rigidly attached heat sink for memory modules is desirable. A heat sink with a more efficient air flow across memory chips on a memory module is also desirable.

BRIEF DESCRIPTION OF DRAWINGS

FIGS. 3A–D show other views of the heat sink attached to the memory module.

FIGS. 6A–B show an alternate embodiment with larger top openings.

DETAILED DESCRIPTION

The present invention relates to an improvement in memory modules. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that riveting a heat sink to a memory module substrate can produce a rigid, sturdy all-in-one memory module/heat sink. Riveting allows the heat sink to be firmly and snugly attached to the memory module substrate.

The inventors have further realized that cooling efficiency can be improved by allowing for air flow under the heat sink, between the heat sink and the memory module substrate. Even though this area between the heat sink and substrate is small and mostly occupied by the memory chips, small gaps between pairs of memory chips can channel air flow past the memory chips, directly cooling them as well as cooling the heat sink from both the under-side and the large, exposed top surface of the heat sink.

The inventors encourage this air flow through the tiny channels between memory chips by adding slots in the heat sink near the top edge of the memory module. These top-edge slots allow air to escape from between the memory module substrate and the heat sink. Air can enter the gaps between the heat sink and the PCB substrate from the open bottom edge near the connectors, and can flow between the memory chips and out the top-edge slots. Stagnant air under the heat sink is reduced, allowing the heat sink to be cooled by air flow across both the outer open surface of the heat sink, and the hidden underside surface of the heat sink that contacts the tops of the memory chips.

Figure 1:
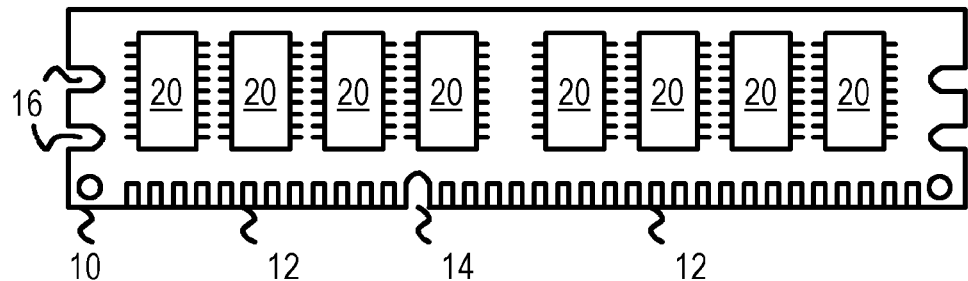
FIG. 1 is a diagram of a memory module with DRAM chips.
Figure 2A:
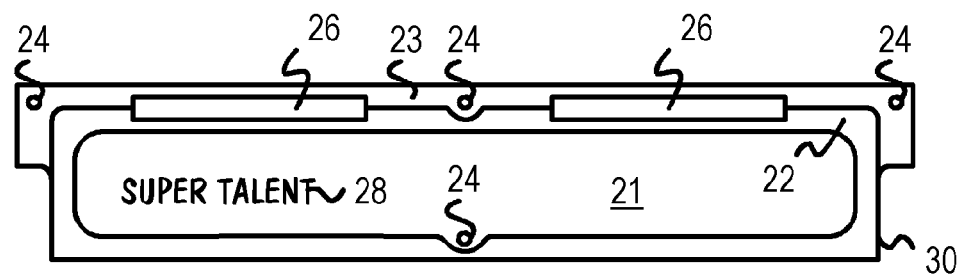
FIG. 2A shows a heat sink with top slots before attachment to a memory module.

FIG. 2A shows a heat sink with two top slots before attachment to a memory module. Two heat-sink plates 30 are used, one for the front surface of the memory module, and the other for the back surface of the memory module. The two plates 30 are held to the memory module substrate and to each other by rivets 24 that fit in holes in plate 30. The upper-side of the upper plate 30 is shown. This upper-side generally fits over the front surface of the memory module shown in FIG. 1.

Plate 30 contains raised ridge 22 that surrounds depression 21. Depression 21 is closer to the surface of the memory module substrate when attached. The underside of depression 21 makes contact with the flat top surfaces of memory chips 20 of FIG. 1. Decal 28 or other markings can be placed in depression 21.

Two top-edge slots 26 are formed in plate 30 near the top edge. Top-edge slots 26 are holes in plate 30 that allow air to pass through. Top-edge slots 26 can be formed on the sloping part of plate 30 above raised ridge 22, between raised ridge 22 and top attachment portion 23. Top attachment portion 23 is closer to PCB substrate 10 than depression 21, which is closer to the PCB substrate than raised ridge 22.

Three rivets 24 are fastened to top attachment portion 23, one between top-edge slots 26 and one in each top corner of substrate 10. A fourth rivet 24 is located near the center of the bottom (connector) edge of substrate 10.

Figure 2B:
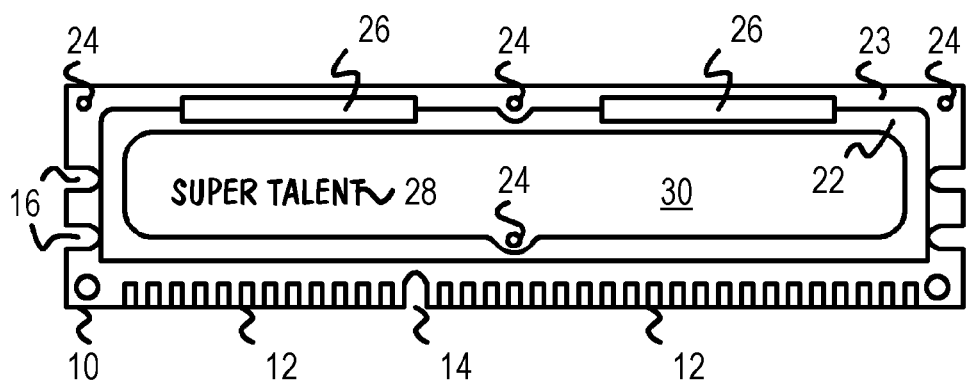
FIG. 2B shows the heat sink with the top slots after attachment to a memory module.

FIG. 2B shows the heat sink with the top slots after attachment to a memory module. Upper plate 30 is fixedly attached to the front surface of PCB substrate 10 of the memory module by rivets 24. Three rivets 24 near the top edge press top attachment portion 23 against the surface of substrate 10, making a firm, sturdy assembly. A fourth rivet 24 near the center of the bottom edge passes through substrate 10, but plate 30 does not make contact with substrate 10 near this fourth rivet. The fourth rivet 24 provides added stability of the mounting of plate 30 (and another plate 30', not shown, attached to the back surface of substrate 10) to substrate 10.

Plate 30 ends before contact pads 12 along the lower edge of substrate 10, allowing these contact pads 12 to be freely inserted into a memory module socket. Notch 14 is offset from center, while edge notches 16 are on the right and left edges of substrate 10. As shown by comparing FIG. 2A to FIG. 2B, the sides of plate 30 are notched inward near the top of upper notches 16 on the memory module, allowing notches 16 to fit into memory module sockets unencumbered by plate 30.

FIGS. 3A–D show other views of the heat sink attached to the memory module. FIG. 3A is a top view showing the top edge of PCB substrate 10 with heat-sink plates 30, 30' attached. Three rivets 24 pass through plates 30, 30' and substrate 10 to rigidly attach plates 30, 30' to substrate 10. Top attachment portion 23 fits snugly with the surface of substrate 10, while raised ridge 22 rises up from top attachment portion 23. Top-edge slots 26 are cut into the sloping portion of plate 30 between top attachment portion 23 and raised ridge 22. A total of four top-edge slots 26 are provided—two in front plate 30 and two more in back plate 30'. The top edges of memory chips and other components of the memory module may be visible through top-edge slots 26 or may be hidden by the thin layer of top attachment portion 23.

FIG. 3B is a bottom view showing the bottom edge of PCB substrate 10 with memory chips contacting the heat-sink plates. The bottom edge of the assembly is open, since the metal contact pads are located along the bottom edge of substrate 10. Memory chips 20 and their leads bonded to substrate 10 are visible through the open bottom edge between heat-sink plates 30, 30'. A fourth rivet 24 passes from front plate 30, through a gap and through substrate 10, then through a second gap to back plate 30'. While not as sturdy as the three rivets along the top edge, the fourth rivet provides additional stability, especially for the bottom edges of front plate 30 and back plate 30'.

Depressions 21 in front plate 30 and back plate 30' make contact with the upper flat surfaces of memory chips 20, providing good heat transfer from the chips to metal heat-sink plates 30, 30'. The sloped edges of plates 30, 30' along the small sides of substrate 10 between notches 16 and the top edge are visible in the background from this view.

FIG. 3C is a side view showing one of the small sides of the memory module. Notches 16 are cut in the small side edges of substrate 10. The portions of substrate 10 at the backs of notches 16 are not shown for clarity in FIG. 3C. Front plate 30 and back plate 30' are connected together by rivet 24 in the upper right corner of FIG. 2B. Plates 30, 30' make contact with the surface of substrate 10 along the whole top edge and along the upper portion of the side edges, but stop at the first notch 16. Other portions of plates 30, 30' are visible in the background extending downward toward the bottom edge of substrate 10.

FIG. 3D is a cross-sectional view of the heat-sink plates, memory chips, and module substrate. Rivet 24 clamps top attachment portion 23 of front plate 30 to the front surface of substrate 10, and passes through substrate 10 and also clamps back plate 30' to the back surface of substrate 10 near its top edge.

The cross-section of front plate 30, starting from the top of FIG. 3D, shows rivets 24 attached through top attachment portion 23, then shows the sloped portion from top attachment portion 23 out to raised ridge 22. Continuing downward along front plate 30, depression 21 is formed to be closer to substrate 10 than raised ridge 22. Depression 21 makes contact with the flat surfaces of memory chips 20 mounted to substrate 10 by their leads.

Figure 4:
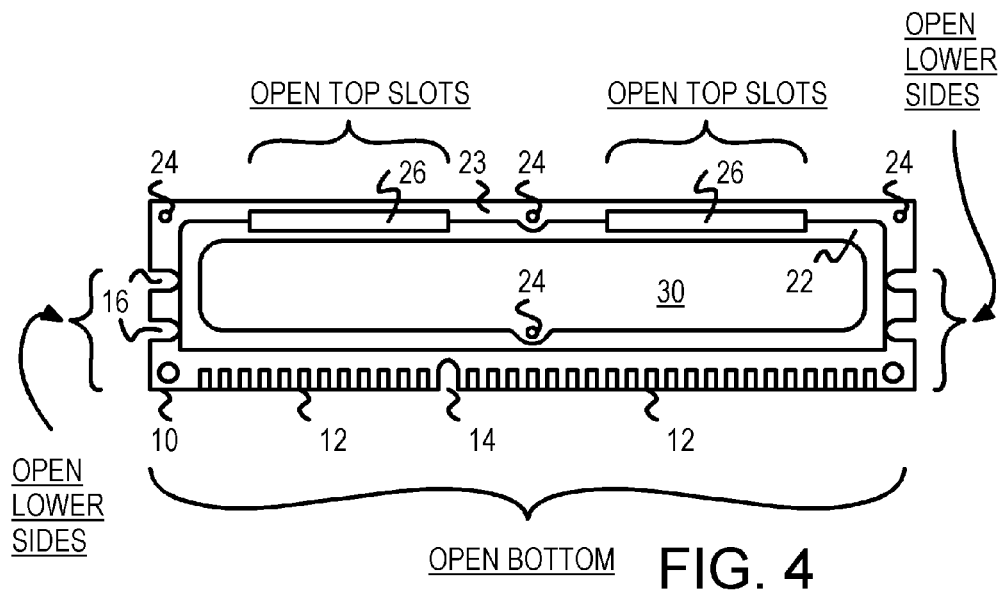
FIG. 4 shows open sides and closed sides of the heat sink.

FIG. 4 shows open sides and closed sides of the heat sink. Front plate 30 and back plate 30' make contact with substrate 10 along top attachment portion 23, including areas around top three rivets 24. While this blocks air flow, top-edge slots 26 are cut in plates 30, 30' to allow for air flow. These four open top slots allow for air flow past the memory chips under plates 30, 30'.

Contact between front plate 30 and back plate 30' and substrate 10 also is made along the two side edges from the top corners near corner rivets 24 to the top of upper notches 16. This plate-to-substrate contact also prevents air flow. However, contact is not made below notches 16, so the lower portions of the sides are open, allowing for air flow.

Front plate 30 and back plate 30' do not make contact with substrate 10 near bottom rivet 24 near connectors or contact pads 12. Instead, an air gap is between plates 30, 30' and substrate 10 near bottom rivet 24 near notch 14. Thus the entire bottom edge along contact pads 12 is open, allowing for air flow. FIG. 4 shows the open edges and slots in brackets, including the open bottom edge, open lower side edges, and open top-edge slots 26.

Figure 5:
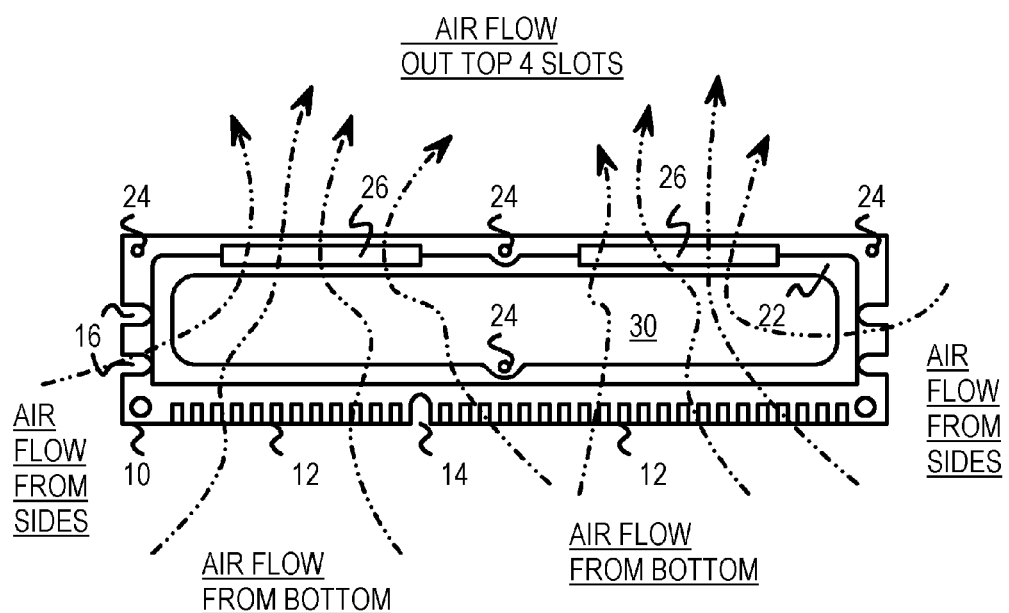
FIG. 5 highlights improved air flow under the heat sink plates and out through the top-edge slots.

FIG. 5 highlights improved air flow under the heat sink plates and out through the top-edge slots. Air can flow in or out of the openings shown by brackets in FIG. 4. Possible paths for air flow are shown as dashed lines in FIG. 5. Air can enter the open lower side edges near side notches 16, pass in gaps between memory chips and substrate 10 and front plate 30 or back plate 30', and exit through top-edge slots 26. Air can also enter anywhere along the bottom edge near contact pads 12, pass in gaps between memory chips and substrate 10 and front plate 30 or back plate 30', and exit through top-edge slots 26. Air paths may zigzag more than shown, and may flow in reverse directions or take other paths.

Allowing such air flow between substrate 10 and front plate 30 or back plate 30' provides for greater cooling of front plate 30 and back plate 30', since each can be cooled not just from the exposed outer surfaces, but also from underneath. The memory chips can also be cooled directly by this air flow. While major cooling still occurs from the exposed outer surfaces of front plate 30 and back plate 30', some additional cooling is provided from underneath. This additional cooling can help even out hot spots and reduce failures, even if the total cooling from underneath is small.

FIGS. 6A–B show an alternate embodiment with larger top openings. The top openings can be enlarged so that top attachment portion 53 near the top three rivets 24 is minimized. Also, rather than contact front plate 30 with substrate 10 along the entire top edge as shown in FIGS. 3–5, plate-to-substrate contact can be made only near three top edge rivets 24. This can be especially seen in the top view of FIG. 6B, where front plate 50 does not contact substrate 10 in top-edge openings 56. Raised ridge 52 can be reduced in size near top-edge openings 56. The larger top-edge openings 56 provide for greater air flow underneath front plate 50 and back plate 50'.

Alternate Embodiments

Several other embodiments are contemplated by the inventors. For example the heat sink may be made from a variety of heat-conducting materials such as aluminum, aluminum alloy, copper, brass, bronze, stainless steel, etc. A thin thermally conductive double-sided adhesive tape (such as Tape No. 8815 made by 3M Company) or metal foil may be placed between the tops of the memory chips and the underside of the heat sink to improve contact with the memory chips. Thermally conductive grease or paste (such as G-749 made by Shin-Etsu Micro Si, Inc.) may also be placed between the tops of the memory chips and the underside of the heat sink to improve contact with the memory chips.

Rather than use rivets, other fasteners could be substituted. For example, small nuts and bolts, or screws and nuts could be used. These fasteners provided secure and fixed attachment rather than wobbly or temporary attachment. Holes for these fasteners can be added to the memory module substrate. These fastener holes are not normally present in a standard memory module.

The memory module PCB substrate can be made slightly taller than normal to provide additional room for the fastener holes and rivets near the top edge where the heat sink makes contact with the PCB substrate. The substrate height from the bottom (connector) edge to the top edge can be increased by 1/8 to 1/4 of an inch, for example, to allow more room for the top edge of the heat sink to lay flat against the substrate.

Two, three or four DRAM chips could be stacked together at each chip location on the memory module. Some memories may have more than one chip select (CS) input, and some combination of these chip selects could be used to select the DRAM chips.

The number of DRAM chips, capacitors, buffers, and other components on each side of the substrate can be varied. Wide or narrow DRAM chips of one, two, four, eight or more bits in width may be substituted. Other kinds of Integrated Circuits (IC's) or chips can be mounted on the substrate too, such as an address or bank decoder, a parity generator, an error detector, and/or a serial programmable device (SPD) for identifying the memory module.

Memory modules may use improved DRAM's such as synchronous DRAM (SDRAM), double data rate (DDR) SDRAM, second-generation double data rate (DDR2) SDRAM, Rambus DRAM (RDRAM), direct Rambus DRAM (DRDRAM) or synchronous-pipelined DRAM (SP-DRAM). Rather than DRAM's, other memory types (SRAM, ROM, EPROM) could be used. Flash memories using electrically-erasable programmable read-only memory (EEPROM) technology, or some other technologies (ferro-electric FRAM, magnetic or magneto-resistive MRAM, etc.) could be used by the memory modules.

Terms such as "top edge", "side", "bottom edge", "left", "right", "front surface", and "back surface" are arbitrarily assigned as shown in the Figures and each term could refer to either surface of the module in relation to the notch. Vias of through-holes may provide electrical connection between the surfaces or intermediate layers. These through-holes could be filled in holes or metal traces between layers rather than open holes, and can also be formed during the PCB processing as an integral part of the PCB. Various alternatives in geometries of the heat-sink plates and memory modules could be substituted.

The invention could be used to stack other kinds of memory chips than DRAM, such as SRAM and flash memories, etc. The invention could be applied to other kinds of modules besides memory modules, and could be used for stacking other kinds of chips such as buffers, registers, latches, processing arrays, etc.

The electrical assignment of functions or signals to "pins", the metal contact pads along the bottom of the module, is usually determined by an industry standard-setting committee, such as JEDEC. JEDEC specifies the order of the pins and the size of the module to allow for interchangeability of modules with sockets. Redundant power and ground pins are usually assigned symmetric positions to avoid reversing the power and ground supplies if the module is inserted backwards. DRAM chips are usually connected to a data pin as close to the chip as possible to minimize wiring lengths and signal delays. Older 72-pin modules are being replaced by 168-pin and larger modules. Multi-layer printed circuit board (PCB) substrates can share the power and ground planes with signal traces to reduce the number of layers used from 8 layers to 6 layers or even 4 layers. Many other configurations are possible. Modules with multiple rows of leads, such as dual-in-line-memory modules (DIMMs) can also benefit from the invention.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. Sect. 1.72(b). Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

The invention claimed is:

1. A heat sink for attachment to a memory module comprising:
    a front plate for attaching to a front surface of the memory module and a back plate for attaching to a back surface of the memory module, each plate comprising:
    a heat-transfer area for making thermal contact with memory chips mounted on the memory module;
    a bottom edge portion that provides a bottom opening between the plate and the memory module for an entire length of a bottom edge when the plate is attached to the memory module, the bottom edge of the memory module containing metal contacts for making electrical contact to a memory module socket;
    a top attachment portion for making contact with a substrate of the memory module near a top edge that is opposite the bottom edge of the memory module;
    fastener holes for fasteners in the top attachment portion, the fasteners for fixedly attaching the plates to the substrate of the memory module;
    a pair of side portions that each make contact with the substrate of the memory module in an upper side portion near the top edge, but do not make contact with the substrate for a lower side portion near the bottom edge; and
    top-edge slots formed near the top edge in the top attachment portion of the plate, the top-edge slots for allowing air flow underneath the plate between the plate and the substrate, from the bottom opening to the top-edge slots,
    whereby air-flow underneath the plate is provided by the top-edge slots.

2. The heat sink for attachment to a memory module of claim 1 wherein the upper side portion extends from the top edge to an upper side notch in the substrate;
    wherein the lower side portion extends from near the bottom edge to the upper side notch in the substrate,
    whereby the upper side portion above the upper side notch is closed by the plate contacting the substrate, but the lower side portion below the upper side notch is open, with a gap between the plate and the substrate.

3. The heat sink for attachment to a memory module of claim 2 wherein the top attachment portion contacts the substrate for an entire length of the top edge of the substrate,
    whereby the top attachment portion contacts the substrate above the top-edge slots.

4. The heat sink for attachment to a memory module of claim 2 wherein the top attachment portion contacts the substrate for contact portions of the entire length of the top edge of the substrate,
    wherein the contact portions surround the fastener holes in the top attachment portion;
    wherein the top-edge slots extend to the top edge, dividing the contact portions of the top attachment portion.

5. The heat sink for attachment to a memory module of claim 2 wherein the fastener holes comprise:
    a top-left fastener hole near a top-left corner between the top attachment portion and a left side portion of the pair of side portions;
    a top-right fastener hole near a top-right corner between the top attachment portion and a right side portion of the pair of side portions;
    a top-center fastener hole in the top attachment portion between the top-edge slots.

6. The heat sink for attachment to a memory module of claim 5 wherein the fastener holes further comprise:
    a bottom fastener hole in the bottom edge portion.

7. The heat sink for attachment to a memory module of claim 6 wherein the bottom fastener hole is about halfway between the pair of side portions.

8. The heat sink for attachment to a memory module of claim 7 wherein the heat-transfer area is a depression in the plate surrounded by a raised ridge in the plate.

9. The heat sink for attachment to a memory module of claim 8 wherein the top-edge slots are formed on a sloping portion of the plate between the raised ridge and the top attachment portion.

10. The heat sink for attachment to a memory module of claim 9 wherein the top-edge slots comprise two slots in the front plate and two slots in the back plate,
    whereby four top-edge slots provide for air-flow underneath the plates.

11. The heat sink for attachment to a memory module of claim 10 wherein the fasteners are rivets, nuts and bolts, or screws and nuts.

12. A thermally-enhanced memory module comprising:
    a substrate having wiring traces formed therein;
    metal contacts along a contactor edge of the substrate,
    the metal contacts for making electrical contact with a memory module socket;
    a first plurality of memory chips mounted on a first surface of the substrate;
    a first heat-transfer plate having an underside surface making thermal contact with the first plurality of memory chips and an exposed surface opposite the underside surface, the exposed surface for dissipating heat;
    a contact-side opening between the first heat-transfer plate and the substrate near the contactor edge of the substrate, the contact-side opening allowing air flow to the first plurality of memory chips;
    an attachment portion of the first heat-transfer plate that contacts the substrate along an opposite edge that is opposite the contactor edge;

a plurality of fasteners in the attachment portion that fixedly attach the first heat-transfer plate to the substrate; and a plurality of slots through the first heat-transfer plate between the attachment portion and a chip-contact portion of the first heat-transfer plate that makes contact with the first plurality of memory chips;

wherein the substrate further comprises fastener holes in the substrate for receiving the plurality of fasteners to fixedly attach the first heat-transfer plate to the substrate, whereby heat-transfer is enhanced by air flow through the plurality of slots, past the plurality of memory chips, and through the contact-side opening.

13. The thermally-enhanced memory module of claim 12 further comprising:

a second plurality of memory chips mounted on a second surface of the substrate that is opposite the first surface;

a second heat-transfer plate having an underside surface making thermal contact with the second plurality of memory chips and an exposed surface opposite the underside surface, the exposed surface for dissipating heat;

a second contact-side opening between the second heat-transfer plate and the substrate near the contactor edge of the substrate, the second contact-side opening allowing air flow to the second plurality of memory chips;

an attachment portion of the second heat-transfer plate that contacts the substrate along an opposite edge that is opposite the contactor edge; and wherein the plurality of fasteners in the attachment portion fixedly attach the second heat-transfer plate to the substrate and to the first heat-transfer plate;

a second plurality of slots through the second heat-transfer plate between the attachment portion and a chip-contact portion of the second heat-transfer plate that makes contact with the second plurality of memory chips.

14. The thermally-enhanced memory module of claim 13 wherein the attachment portion comprises an entire length of the opposite edge of the substrate.

15. The thermally-enhanced memory module of claim 13 wherein the attachment portion comprises contact portions of the opposite edge of the substrate;

wherein the contact portions comprises less than an entire length of the opposite edge.

16. The thermally-enhanced memory module of claim 14 wherein the attachment portion further comprises upper side portions along upper portions of sides of the substrate.

17. The thermally-enhanced memory module of claim 16 wherein the upper side portions are portions with no side notches.

18. The thermally-enhanced memory module of claim 17 wherein the substrate is a printed-circuit board (PCB) and wherein the plurality of fasteners are rivets, screws and nuts, or nuts and bolts.

19. A memory module comprising:

memory means for storing data;

substrate means for supporting the memory means;

fastener holes in the substrate means;

contactor means, along a contactor edge of the substrate means, for making electrical contact when the memory module is inserted into a socket;

wiring means, within the substrate means, for electrically connecting the memory means to the contactor means;

heat-sink means, made of heat-conducting material, for dissipating heat from the memory means;

depression means, in the heat-sink means, for thermally contacting the memory means;

top attachment portion means, in the heat-sink means and along an opposite edge of the substrate means, for physically contacting the substrate means along the opposite edge;

fastener means, attached to the top attachment portion means, for fixedly attaching the heat-sink means to the substrate means through the fastener holes in the substrate means; and opposite-edge slot means, formed between the top attachment portion means and the depression means, for allowing air flow through the heat-sink means between the memory means and the opposite edge, whereby air-flow under the heat-sink means is improved by the opposite-edge slot means.

20. The memory module of claim 19 wherein the heat-sink means comprises a first sink means for attaching to a first surface of the substrate means and a second sink means for attaching to a second surface of the substrate means.

* * * * *